US008791021B2

(12) United States Patent
Serry et al.

(10) Patent No.: US 8,791,021 B2
(45) Date of Patent: Jul. 29, 2014

(54) SILICON GERMANIUM MASK FOR DEEP SILICON ETCHING

(75) Inventors: Mohamed Serry, Cairo (EG); Andrew Rubin, Thuwal (SA); Mohamed Refaat, Cairo (EG); Sherif Sedky, Giza (EG); Mohammad Abdo, Cairo (EG)

(73) Assignee: King Abdullah University of Science and Technology, Thuwal (SA)

( * ) Notice: Subject to any disclaimer, the term of this patent is extended or adjusted under 35 U.S.C. 154(b) by 69 days.

(21) Appl. No.: 13/409,868

(22) Filed: Mar. 1, 2012

(65) Prior Publication Data

US 2012/0225557 A1   Sep. 6, 2012

Related U.S. Application Data

(60) Provisional application No. 61/448,022, filed on Mar. 1, 2011, provisional application No. 61/592,375, filed on Jan. 30, 2012.

(51) Int. Cl.
*H01L 21/311* (2006.01)

(52) U.S. Cl.
USPC .................. 438/694; 438/707; 216/2; 216/67

(58) Field of Classification Search
USPC ............. 118/723 I; 216/2, 67; 217/2; 257/14, 257/198, 288, 316, 330, 347, 415, 506, 554, 257/77; 427/533; 428/220; 438/1, 14, 152, 438/197, 199, 216, 243, 255, 270, 285, 479, 438/48, 50, 52, 592, 694, 715, 719, 740, 438/753

See application file for complete search history.

(56) References Cited

U.S. PATENT DOCUMENTS

| 5,096,536 | A  | * | 3/1992 | Cathey, Jr. ................... 438/715 |
|---|---|---|---|---|
| 5,607,542 | A  | * | 3/1997 | Wu et al. ....................... 438/707 |
| 6,440,766 | B1 |   | 8/2002 | Clark |
| 7,563,379 | B2 | * | 7/2009 | Suzuki et al. ..................... 216/2 |
| 7,749,789 | B2 |   | 7/2010 | Papageorigiou |
| 2002/0094651 | A1 | * | 7/2002 | Farrar .......................... 438/296 |
| 2004/0009649 | A1 | * | 1/2004 | Kub et al. ..................... 438/459 |
| 2004/0061128 | A1 | * | 4/2004 | Pierson et al. ................ 257/183 |
| 2005/0101096 | A1 | * | 5/2005 | Li et al. ........................ 438/316 |

FOREIGN PATENT DOCUMENTS

JP    09-213709    *   8/1997    ............ H01L 21/331

OTHER PUBLICATIONS

Oka et al., machine translation of JP'709, Aug. 15, 1997.*
d'Agostino et al. Plasma etching of Si and SiO2 in SF6-O2 mixtures J. Appl. Phys. 52 (1) Jan. 1981 pp. 162-167.*
Oehrlein et al., Studies of the reactive ion etching of SiGe alloys, J. Vac .Sci. Technol. A 9 (3), May/Jun. 1991 pp. 768-774.*

(Continued)

*Primary Examiner* — Duy Deo
*Assistant Examiner* — Erin Bergner
(74) *Attorney, Agent, or Firm* — Steptoe & Johnson LLP

(57) ABSTRACT

Polycrystalline silicon germanium (SiGe) can offer excellent etch selectivity to silicon during cryogenic deep reactive ion etching in an $SF_6/O_2$ plasma. Etch selectivity of over 800:1 (Si:SiGe) may be achieved at etch temperatures from −80 degrees Celsius to −140 degrees Celsius. High aspect ratio structures with high resolution may be patterned into Si substrates using SiGe as a hard mask layer for construction of microelectromechanical systems (MEMS) devices and semiconductor devices.

20 Claims, 12 Drawing Sheets

(56) References Cited

OTHER PUBLICATIONS

Oehrlein et al, selective dry etching of Germanium with Respect to Silicon amd Vice Versa, J. Electrocehm. Soc., vol. 138, No. 5, May 1991, pp. 1443-1452.*

Tachi et al., Low-temperature reactive ion etching and microwave plasma etching of silicon, Appl. Phys. Lett. 52 (8), Feb. 22, 1988, pp. 616-618.*

International Search Report and Written Opinion from PCT/US2012/27245 mailed Jun. 13, 2012.

* cited by examiner

SILICON GERMANIUM MASK FOR DEEP SILICON ETCHING

CLAIM OF PRIORITY

This application claims priority to U.S. Provisional Patent Application No. 61/448,022, filed on Mar. 1, 2011, and U.S. Provisional Patent Application No. 61/592,375, filed on Jan. 30, 2012, each of which is incorporated by reference in its entirety.

TECHNICAL FIELD

This invention relates to semiconductor devices and more particularly relates to a method for etching high aspect ratio structures.

BACKGROUND

In microelectromechanical systems (MEMS) and semiconductor devices, high aspect ratio trenches are common features. For example, MEMS rotational rate sensors and accelerometers, micro-fluidic mixing devices, micro-mirrors, micro-pillars, deep trench capacitors and isolation for high frequency circuitry, and power devices all include high aspect ratio features.

Conventionally, high aspect ratio features are formed with cryogenic deep reactive ion etching (cryogenic DRIE) processing. For these particular and many other applications, high surface finish of the resulting Si structure is required, and therefore cryogenic DRIE of Silicon is highly favorable. Chemicals and plasmas for etching the high aspect ratios are selected based on the material being etched to form the structures. For example, $SF_6/O_2$ plasma is often used for anisotropic etching of high aspect ratio trenches in silicon. Forming high aspect ratio structures is dependent, in part, on selecting a masking material with high etch selectivity to the material being etched in the cryogenic DRIE plasma. Additionally, the mask material should apply conformally to the substrate being etched and deposited at temperatures that do not damage other components on the substrate. Conventionally, for deep cryogenic etching silicon in $SF_6/O_2$, etch mask materials have included silicon oxide, silicon nitride, aluminum, chromium, and photoresist. With silicon oxide as a mask material selectivity may reach 100:1 when etching silicon in an $SF_6/O_2$ plasma. That is, for every 1 μm of silicon oxide etched in the $SF_6/O_2$ plasma, 100 μm of silicon is etched.

In order to realize innovative solutions in many modern electronic devices, structures with smooth surface finish are required. At the present moment achieving the high aspect ratio structures using known values of selectivity of etching material, thick masks are required. The increasing of the mask thickness creates additional difficulties in manufacturing of high aspect ratio structures. Among those difficulties, the most common include: achieving the high angel slopes of the masks which directly affect the profile of the etching; most of the existing polymer masks have their tendency of cracking at low temperatures; and good uniformity is difficult to achieve with thick masks. Additionally, thick etch masks reduce the resolution of the pattern transferred into the etch mask and into the substrate and impose further limitations on the minimum features that may be transferred (e.g., mask critical dimension) and overall uniformity. The sidewall profile of the high aspect ratio features in the substrate degrades with thicker etch masks. Thus, a thin etch mask layer is preferred for high aspect ratio etching.

One previous solution is the use of alumina (aluminum oxide) as an etch mask for high aspect ratio etching. Alumina has a selectivity of over 5000:1 for etching silicon in an $SF_6/O_2$ plasma. However, there are still some problems with film cracking, sensitivity to humidity, and excessive base solubility, in addition to the need of a special methods to deposit thin and conformal layers of alumina (i.e., Atomic Layer Deposition) cause problems in using alumina as an etch mask. Additionally, the stripping of alumina for post-etch processing is difficult and requires hydrofluoric (HF) acid or other exotic etches, which may cause damage to the structures already present on the substrate such as underlying complimentary metal-oxide-semiconductor (CMOS) transistors.

Other previous solutions include metal masks such as aluminum, copper, chromium and nickel, which have high selectivity with respect to silicon in $SF_6/O_2$ plasmas. However metal films are electrically conductive, which may result in electric field effect, undercut, and profile notching. Etching of silicon substrates with metal masks may require dedicated chambers because of the contaminating effects of re-deposition of the metal masks, which negatively affects the etching quality and chamber lifetime. Additionally, metal films may require exotic etchants (such as $HNO_3$ for copper or $H_2SO_4$ for chromium) for pattern transfer into the etch mask or sputtering at high temperatures as in the case for aluminum, which might not be suitable for CMOS post-processing. Re-sputtering and re-deposition of metal masking material causes micrograss or micromasking on the silicon substrate, which may result in process contamination and reduce the sticking coefficient of the passivation layer on the sidewalls of the trench and may lead to isotropic profiles.

Another previous solution uses photoresist as the etch mask. However, photoresists are inadequate for cryogenic processes because they crack at sub-zero temperatures. Furthermore, photoresists have etch selectivity as low as 40:1 to silicon in an $SF_6/O_2$ plasma. The low selectivity often restricts the aspect ratio of features etched with photoresist etch masks to 300 μm and places limits on the lateral dimensions.

SUMMARY

According to one embodiment, a method includes depositing a silicon germanium etch mask on a semiconductor material, wherein the semiconductor material is not silicon germanium. The method also includes patterning the silicon germanium etch mask with a plurality of features. The method further includes transferring the plurality of features in the silicon germanium hard mask to the semiconductor material.

The term "coupled" is defined as connected, although not necessarily directly, and not necessarily mechanically.

The terms "a" and "an" are defined as one or more unless this disclosure explicitly requires otherwise.

The term "substantially" and its variations are defined as being largely but not necessarily wholly what is specified as understood by one of ordinary skill in the art, and in one non-limiting embodiment "substantially" refers to ranges within 10%, preferably within 5%, more preferably within 1%, and most preferably within 0.5% of what is specified.

The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

A method of making high aspect ratio features, such as tranches, can include depositing a etch mask on a semiconductor material, patterning the etch mask with a plurality of features, and transferring the plurality of features in the etch mask to the semiconductor material. In one aspect, the etch mask can include silicon germanium and the semiconductor material is not silicon germanium. The semiconductor material can include silicon. The semiconductor material can be a silicon substrate.

In one aspect, the step of depositing a etch mask can include performing chemical vapor deposition of silicon germanium. The step of transferring the plurality of features to the semiconductor material can include performing a reactive ion etch of the semiconductor material. The step of performing a reactive ion etch can include etching the semiconductor material with an $SF_6/O_2$ plasma. The etch can be a deep reactive ion etch.

In another aspect, the method can include cooling the semiconductor material to a temperature between −80 degrees Celsius and −140 degrees Celsius before transferring.

Patterning the etch mask can include forming a transfer material on the etch mask, patterning the plurality of features into the transfer material, and transferring the plurality of features into the etch mask.

The step of forming a transfer material can include forming a photoresist film on the etch mask. Patterning the plurality of features into the transfer material can include patterning with at least one of photolithography, ion beam lithography, or electron beam lithography. The step of transferring the plurality of features can include transferring high aspect ratio features.

In another aspect, the plurality of features can include components of at least one of a microprocessor, a micro electro-mechanical system (MEMS) rotational rate sensor, a MEMS accelerometer, a micro-fluidic mixing device, a micro-mirror, a micro-pillar, a deep trench capacitor, an isolation for high frequency circuitry, or a power device.

In another aspect, the method can include integrating the plurality of features into at least one of a mobile phone, a hand-held personal communication systems (PCS) unit, a portable data unit, a personal data assistant, a GPS enabled device, a navigation device, a set top box, a music player, a video player, an entertainment unit, and a fixed location data unit.

The method can include removing the etch mask after transferring the plurality of features in the etch mask to the semiconductor material. The step of removing the etch mask can include performing a reactive ion etch of the etch mask. The reactive ion etch can be carried out at very low ICP powers and low $SF_6/O_2$ ratio that doesn't affect the features on the substrate. Performing a reactive ion etch can include etching the etch mask with an $SF_6/O_2$ plasma.

In one aspect, the method can include maintaining the etch mask at a temperature between 10 degrees Celsius and −110 degrees Celsius before removing the etch mask. The etch mask comprises boron doping. The etch mask can include polycrystalline silicon germanium.

Transferring the plurality of features into the etch mask can include etching the etch mask with an $SF_6/O_2$ plasma at a temperature between 10 degrees Celsius and −110 degrees Celsius.

In another aspect, the method can include forming a transfer material on a semiconductor material, patterning the plurality of features into the transfer material, wherein at least a portion of transfer material is removed from the semiconductor material.

The method can include depositing an etch mask layer, and at least a portion of the etch mask layer is in direct contact with the semiconductor material, and at least a portion of the etch mask layer is on top of the transfer material;

The method can include removing the transfer material from the semiconductor material, wherein the plurality of features are transferred to the etch mask layer.

Surprisingly, the silicon germanium mask and etch system can have a very high etch silicon etch selectivity, reaching five to ten time better selectivity than $SiO_2$. In addition, the silicon germanium mask and etch system can result in very low chamber contamination. For example, the process can be run for days without cleaning, thereby minimizing maintenance downtime. The silicon germanium mask is a low-stress thin film, which can provide high mask resolution and resistance to cracking. Another advantage is that the non-metallic material can be deposited by LPCVD or PECVD processes, nominally at temperatures as low as 195° C. which can be compatible with CMOS backend processes and can be easily removed after etch step without the need for a dedicated etcher.

Other aspects, embodiments, and features will be apparent from the following description, the drawings, and the claims.

BRIEF DESCRIPTION OF THE DRAWINGS

The following drawings form part of the present specification and are included to further demonstrate certain aspects of the present invention. The invention may be better understood by reference to one or more of these drawings in combination with the detailed description of specific embodiments presented herein.

DETAILED DESCRIPTION

Various features and advantageous details are explained more fully with reference to the nonlimiting embodiments that are illustrated in the accompanying drawings and detailed in the following description. Descriptions of well known starting materials, processing techniques, components, and equipment are omitted so as not to unnecessarily obscure the invention in detail. It should be understood, however, that the detailed description and the specific examples, while indicating embodiments of the invention, are given by way of illustration only, and not by way of limitation. Various substitutions, modifications, additions, and/or rearrangements within the spirit and/or scope of the underlying inventive concept will become apparent to those skilled in the art from this disclosure.

Figure 1:
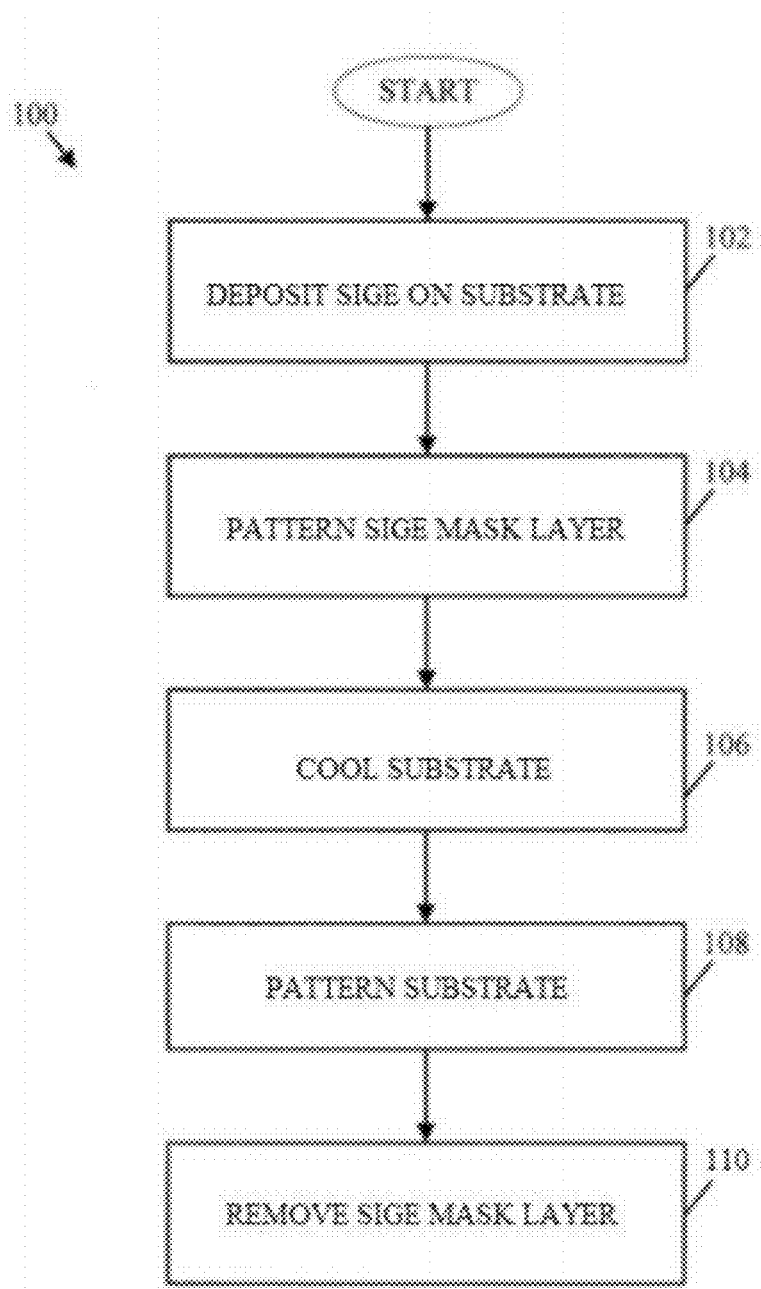
FIG. 1 is a flow chart illustrating a method for cryogenic etching of high aspect ratio structures with a silicon germanium hard mask according to one embodiment of the disclosure.
Figure 2A:
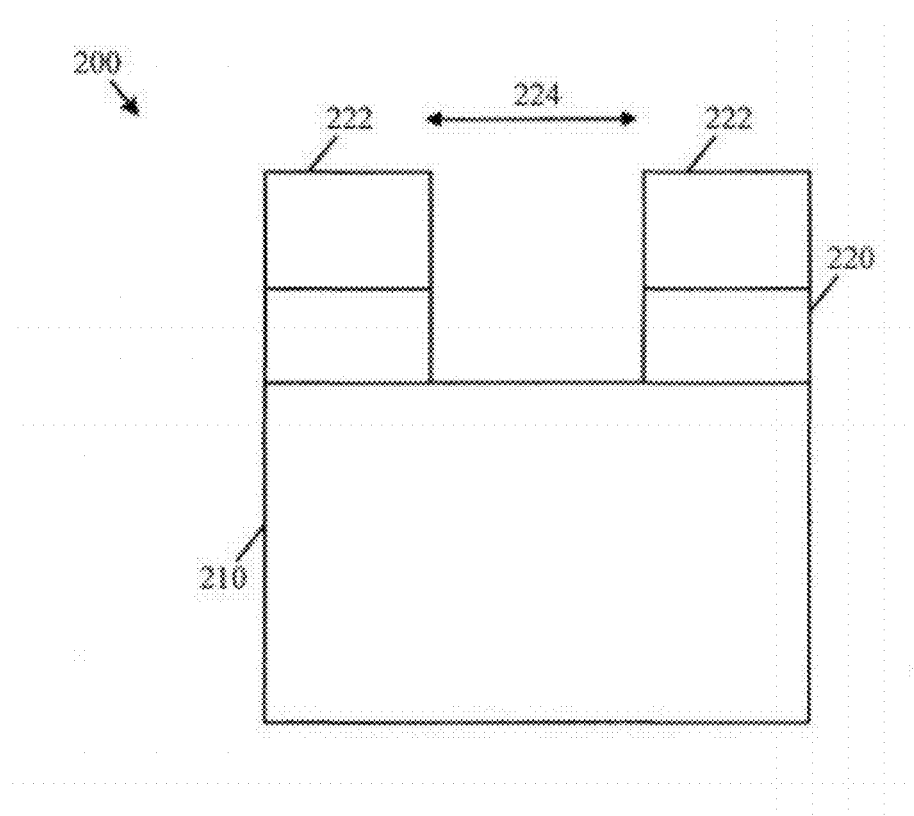
FIGS. 2A-C are block diagrams illustrating a method for etching high aspect ratio structures with a silicon germanium hard mask according to one embodiment of the disclosure.

FIG. 1 is a flow chart illustrating a method for cryogenic etching of high aspect ratio structures with a silicon germanium hard mask according to one embodiment of the disclosure. A method 100 begins at block 102 with depositing silicon germanium (SiGe) on the substrate. The SiGe may be deposited through a low pressure or plasma enhanced chemical vapor deposition (LPCVD or PECVD) process at temperatures compatible with CMOS transistors already present on the substrate. At block 104 the SiGe layer is patterned to form an etch mask layer. The features in the etch mask layer may be substantially similar to the trenches etched into the substrate. FIG. 2A is a block diagram illustrating a portion of a semiconductor device after patterning of the etch mask layer. A device 200 includes a substrate 210, a patterned etch mask 220, and a patterned transfer layer 222. The substrate may be, for example, silicon, and the patterned etch mask 220 may be, for example, silicon germanium.

The patterned transfer layer 222 may be a sacrificial layer for transferring a pattern into the etch mask 220. For example, the transfer layer 222 may be a photoresist patterned by photolithography, electron beam lithography, or ion beam lithography to include a pattern 224 with a plurality of features such as trenches. Although only one trench in the pattern 224 is illustrated, the pattern 224 may include multiple trenches or other features. The pattern 224 may be transferred to the etch mask 220 through a reactive ion etching process, sputtering process, or wet etch process.

Referring back to FIG. 1, at block 106 the substrate may be cooled cryogenically to a temperature between −80 degrees Celsius and −140 degrees Celsius. At block 108 the substrate is patterned using the SiGe etch mask.

Figure 2B:
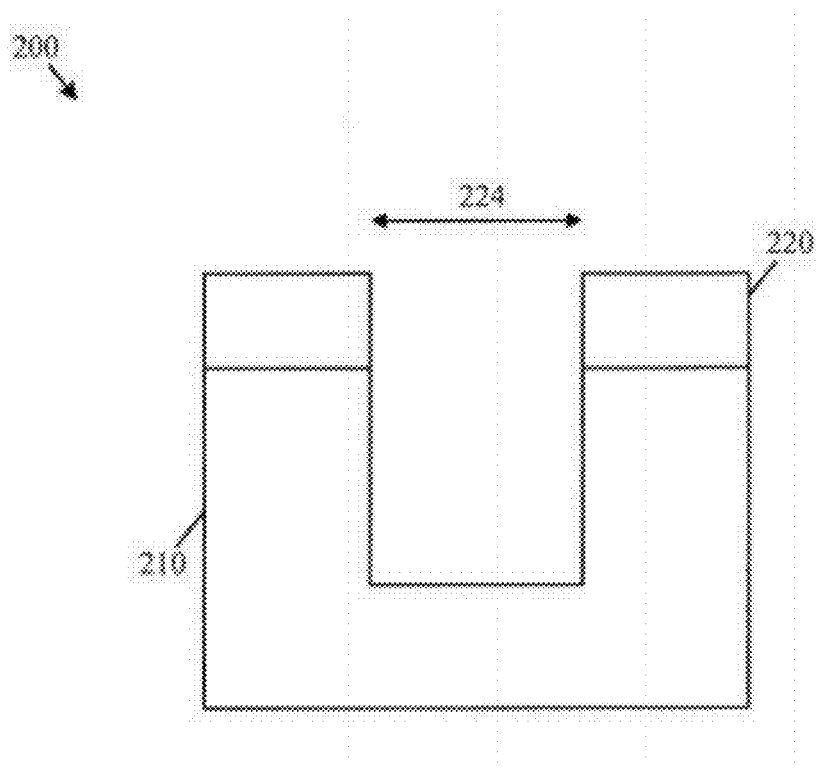

FIG. 2B is a block diagram illustrating high aspect ratio structures etched into a substrate according to one embodiment of the disclosure. The feature 224 may be transferred from the etch mask 220 to the substrate 210. For example, the substrate 210 may be exposed to an $SF_6/O_2$ plasma while the substrate 210 is cooled to cause reactive etching of the substrate 210. According to one embodiment, the etch selectivity between silicon and silicon germanium may be as high as 200:1. Because the etch selectivity between the substrate 210 and the etch mask 220 is high, little to none of the etch mask 220 is etched during transfer of the feature 224 into the substrate 210. The thickness of the etch mask 220 may be selected to survive the etch process for etching the substrate 210 and an overetch margin for ensuring the etch has completed.

According to one embodiment, the transfer layer 222 may be stripped before etching the substrate 210. According to another embodiment, the transfer layer 222 may remain on the substrate 210 and be etched by the reactive ion etch during patterning of the substrate 210. For example, when the transfer layer 222 is a photoresist, the reactive oxygen molecules in the $SF_6/O_2$ RIE plasma may etch the transfer layer 222. The reactive ion etch may or may not completely remove the transfer layer 222.

Figure 2C:
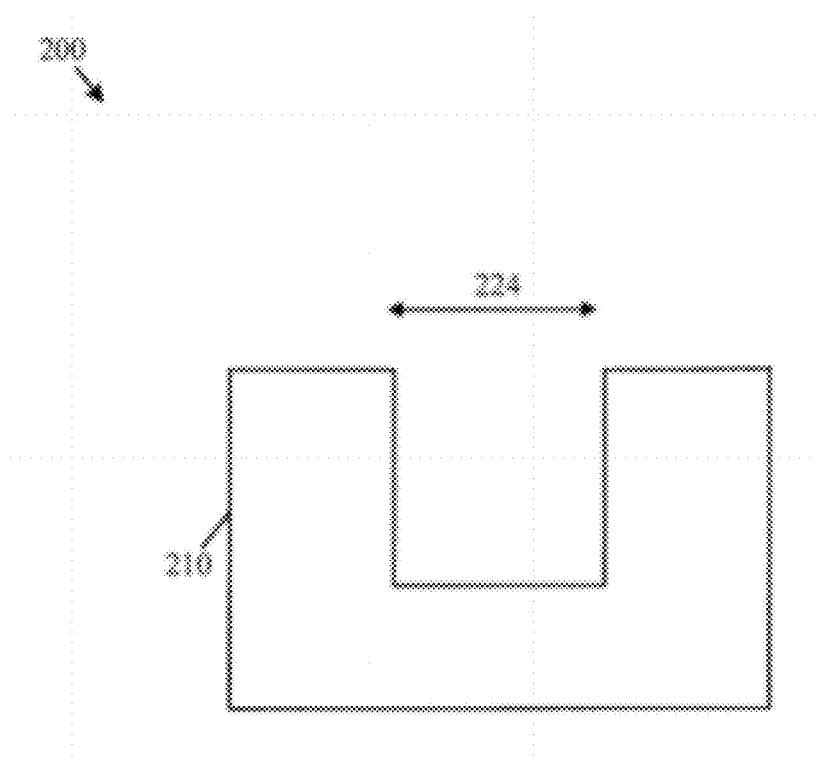

One of the main advantages of the SiGe mask is that it can be etched using the same silicon etching chemistry but at higher temperatures (+10 to −110° C.). FIG. 2C shows that after high aspect ratio structures etched into substrate 210, the etch mask 220 can be removed by using the same silicon etching chemistry but at higher temperatures.

Referring back to FIG. 1, at block 110, the SiGe mask layer can be removed without damaging the patterned substrate and features.

In some embodiments, the SiGe mask can be patterned by other method, such as liftoff method. In a liftoff process, the photoresist layer is formed and inversely patterned as a sacrificial layer before the deposition of SiGe mask layer. After SiGe layer is formed, the photoresist layer is removed together with part of deposited SiGe layer covering it, only SiGe mask layer having direct contact with the underlying substrate stays, thereby patterning the SiGe etch mask layer.

Figure 3A:
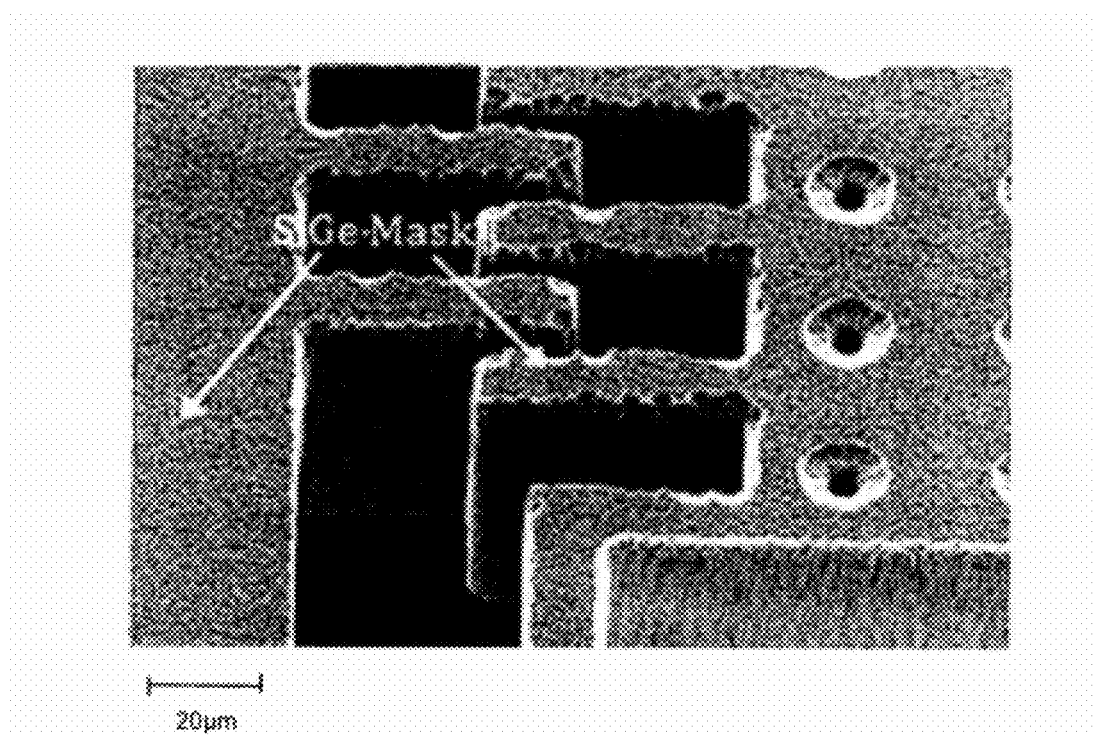
FIGS. 3A and 3B are scanning electron micrographs of high aspect ratio structures etched into silicon with a silicon germanium hard mask according to embodiments of the disclosure.
Figure 3B:
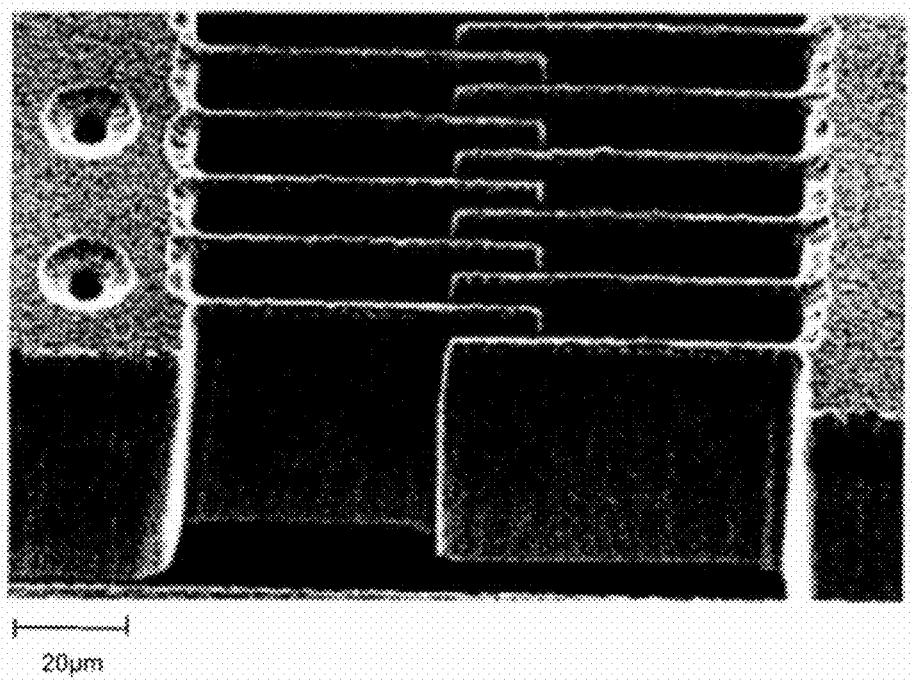

FIGS. 3A and 3B are scanning electron micrographs of high aspect ratio structures etched into silicon with a silicon germanium hard mask according to embodiments of the disclosure.

Silicon germanium (SiGe) as an etch mask offers improved etch selectivity over conventional etch mask materials. Additionally, silicon germanium does not require high temperatures or other specific process conditions during deposition that may cause harm to devices already present.

Figure 4A:
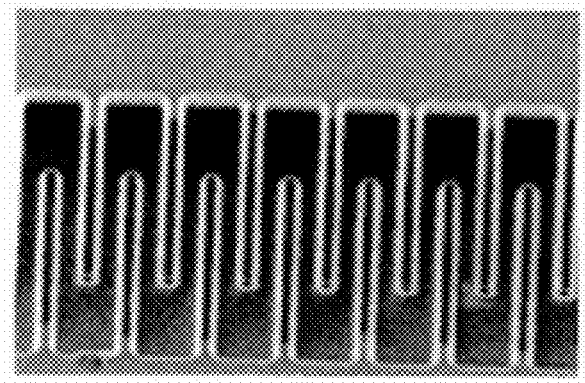
FIGS. 4A-B are scanning electron micrographs of high aspect ratio structures etched into silicon with a silicon germanium hard mask according to embodiments of the disclosure.
Figure 4B:
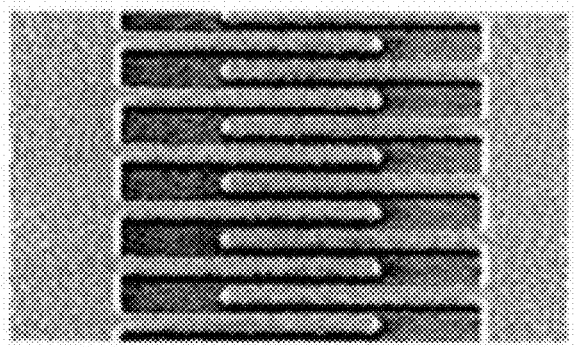

Thus, it is possible to etch the masking layer and the silicon deep trench using the same recipe and control selectivity by varying the etching temperature. This is demonstrated in the SEM images in FIGS. 4A-B, which show that the boron doped $Si_{61}Ge_{39}$ film is almost unaffected after exposure to Si etcher at −140° C. for 70 minutes, which proves the increased etching resistance of the film at temperatures lower than −80° C. However, increasing the etching temperature to −15° C. drops the etching selectivity dramatically to the extent that the film etches at a rate that exceeds 3.75 μm/min. Therefore, the SiGe masking layer can be patterned almost 37 times faster than oxide masks which typically etch at ~0.1 μm/min. It might be reasonably expected that the chemical resistance of the film is the main factor behind the dependence of selectivity on etching temperatures. Etching temperature is believed to be the key factor in controlling the adsorption (i.e., chemisorption) of the fluorine atoms (F) into the SiGe mask, as well as, its effect on the reaction enthalpy and the dissociation energy of the bonds. At higher temperatures (i.e., +10 to −110° C.), the F atoms are more reactive with Si atoms in the SiGe and less dissociation energy is required to break the Si—Ge bond. Therefore, F atoms penetrate the film and deplete it from Si, which makes the film weaker under mechanical etching due to ion bombardments and it etches at a very fast rate. As the temperature gets lower (<−120° C.), the dissociation energy starts to increase which makes the film more chemically resistant.

Figure 5:
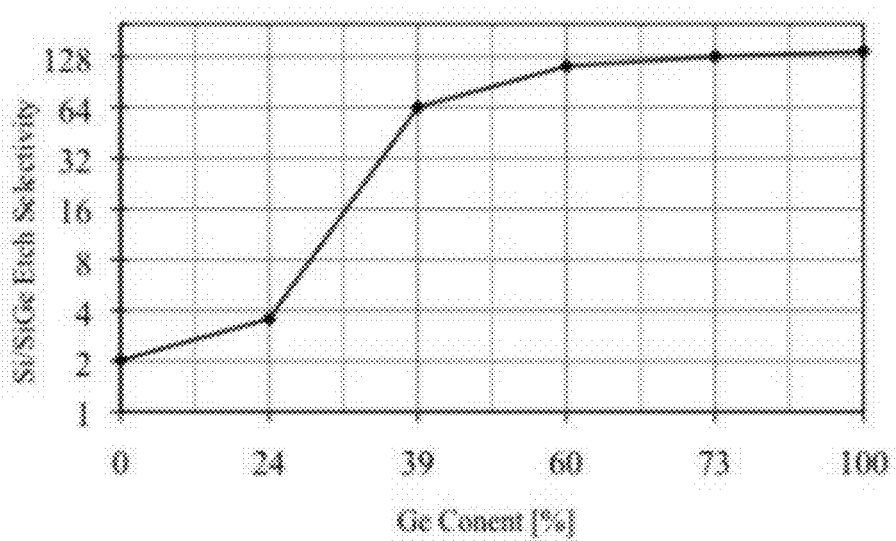
FIG. 5 is a diagram illustrating effect of varying the Ge content on the etch selectivity of p-type SiGe film according to one embodiment of the disclosure.

For the same boron concentration, the Ge content can play an important role in determining the selectivity of the $Si_{1-x}Ge_x$ masking layer. As shown in FIG. 5, for Ge content lower than 25%, the etch selectivity can be very low. As the Ge content exceeds a threshold (25%), the selectivity is significantly increased. However, for 60% Ge or higher, selectivity does not depend strongly on the Ge content. Since the etching of the SiGe in the DRIE is predominantly a chemical etching process, this can be attributed to a presumably stronger chemical bonding between the Si and Ge at higher Ge content, which preserves Si atoms and reduces its affinity to F atoms. This increases the chemical resistance of the film and thus its selectivity towards silicon. At higher Ge content Si—Ge bonding is already high enough to prevent Si from reacting with F neutrals therefore film chemical resistance doesn't change significantly.

Figure 6:
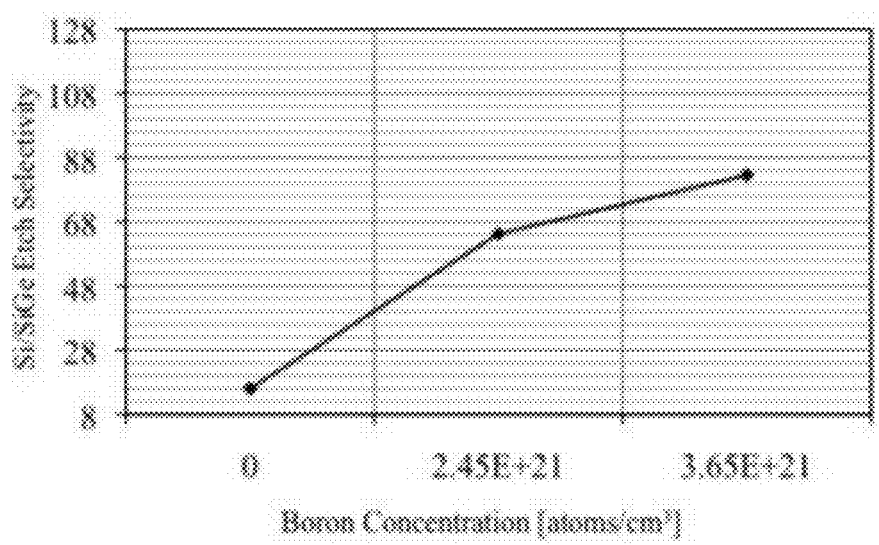
FIG. 6 is a diagram illustrating effect of the concentration of boron in situ doping on etch selectivity of SiGe film according to one embodiment of the disclosure.

As shown in FIG. 6, for the same Ge content, increasing boron concentration to around 1021 improves selectivity by a factor of 5. Unlike the behavior in the case of varying Ge content, the effects of boron doping on increasing selectivity can't be attributed to the chemical stability of the film but rather related to the electronic properties of the mask. Boron increases the p+ doping of the film and hence two main theories can be adopted to explain its effect on selectivity. The first, is based on the charge transfer theory, see Y. H. Lee, M. Chen, A. A. Bright, "Doping effects in reactive plasma etching of heavily doped silicon", J. Appl. Phys. Lett., vol. 46, pp. 260-262, 1985, which is incorporated by reference in its entirety, which assumes that in the case of the p+ doped mask, the valence electron should be first excited to the empty conduction band before it is tunneled through to the F atom, which retards the etching reaction. The second theory that can be adopted to explain this effect is based on the charge repulsion effect, see C. J. Mogab, H. J. Levinstein, "Anisotropic plasma etching of polysilicon", J. Vac. Sci. Technol., vol. 17, pp. 721-262, 1980, which is incorporated by reference in its entirety, which assumes Coulomb repulsion between the uncompensated acceptor (B− in the case of our SiGe mask) and F−. Both lead to an accelerated etching of the substrate and a retarded etching of the mask. As a result of these two mechanisms the etch rate of the SiGe mask is much slower than that of the substrate which yields the higher selectivity.

Table 1 shows the effect of temperature, High Frequency (HF) and Low Frequency (LF) plasma modes on etching selectivity. It is clear that SiGe film selectivity increases by increasing the power of the HF and LF plasma modes. For HF mode, the increase in selectivity can be attributed to more dissociation of the silane ($SiH_4$) and germane ($GeH_4$) as a result of the increase of the HF power, which enhances the quality of bonding make the film more chemically resistant (i.e., stronger Si—Ge bonds relative to F atoms). Whereas at higher LF plasma mode, the film is bombarded with the inert gas ions (i.e., Ar), which assist in enhancing the chemical reactions. This result in stronger Si—Ge bonding and a more densified film, which, makes it more chemically as well as mechanically stable and therefore increases its selectivity.

TABLE 1

Si/SiGe etch selectivity at different deposition temperatures and plasma powers.

| Deposition Temperature | LF Plasma | HF Plasma | Maximum Selectivity |
|---|---|---|---|
| 600° C. | 0 Watts | 0 Watts | 1:130 |
| 400° C. | 15 Watts | 15 Watts | 1:270 |
| 250° C. | 15 Watts | 15 Watts | 1:141 |

Figure 7A:
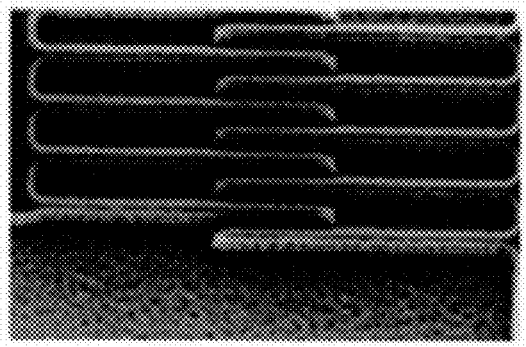
FIGS. 7A-C are scanning electron micrographs of high aspect ratio structures etched into silicon with a silicon germanium hard mask according to embodiments of the disclosure.
Figure 7B:
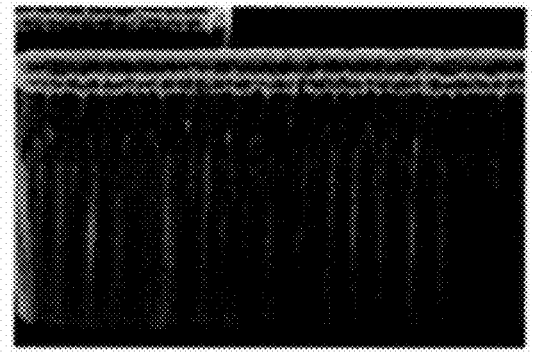
Figure 7C:
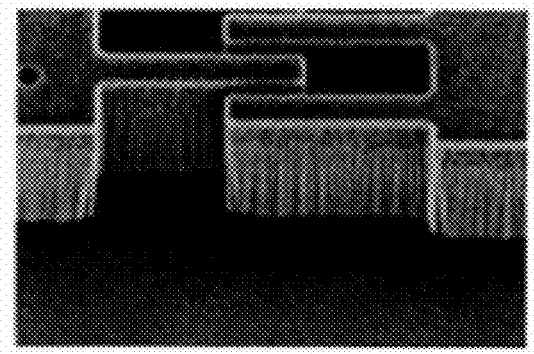

SiGe mask was used to etch Si deep trenches using the parameters in Table 2. Etching profile also at −120° C. is show in FIGS. 7A-C, in which it is clear that aspect ratios up to 30:1 are achievable with no undercut, notching or mask damage. FIG. 7A shows a 2.5 μm thick $Si_{61}Ge_{39}$ mask before deep Si etch, and FIGS. 7B and 7C show that after etching, 60 μm deep trench is formed in Si substrate at −120° C., 90 sccm $SF_6$, 9 sccm $O_2$, ICP power of 1000 W and RF power of 4 W. It is clear that the SiGe mask survived etching with no undercut or notching for 30:1 aspect ratio (FIG. 7B), and 10:1 aspect ratio (FIG. 7C).

TABLE 2

Optimized Si etching recipe

| Etch parameter | Units | Value |
|---|---|---|
| $SF_6$ | sccm | 70 |
| $O_2$ | sccm | 6 |
| Temperature (SiGe/Si) | Celsius | −140 |
| Etch Rate | μm/min | ~3.7 |
| ICP | Watts | 900 |
| RIE | Watts | 5 |
| Pressure | mTorr | 10 |
| Helium Pressure | Torr | 10 |

Figure 8:
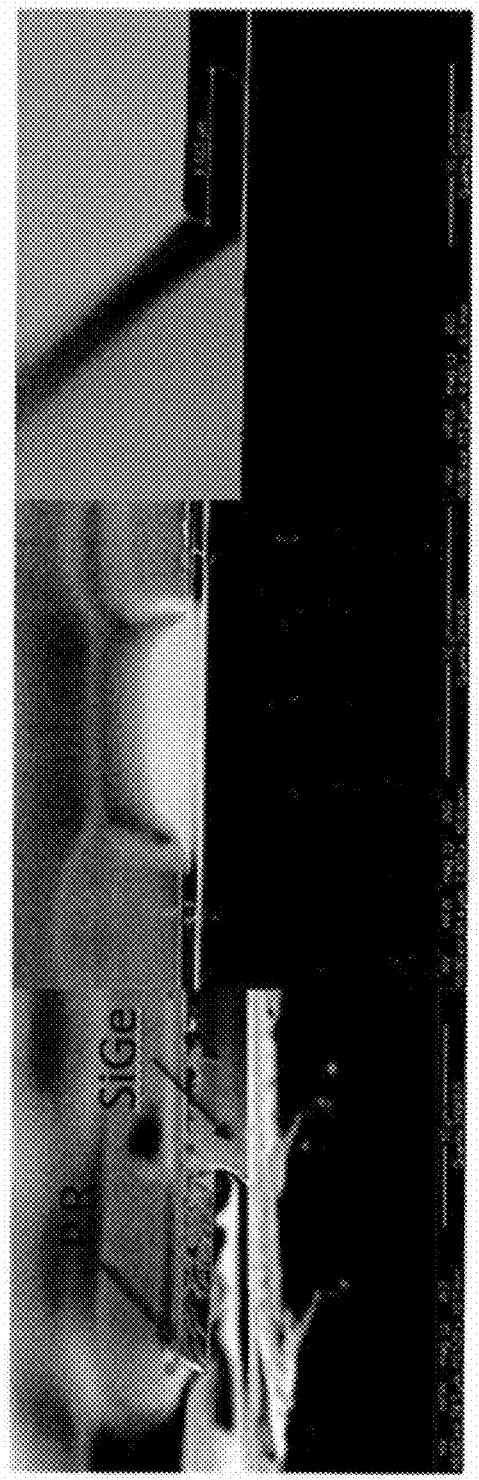
FIG. 8 is a selection of scanning electron micrographs illustrating the effect of temperature on the etching of silicon germanium hard mask layers according to embodiments of the disclosure.
Figure 8:
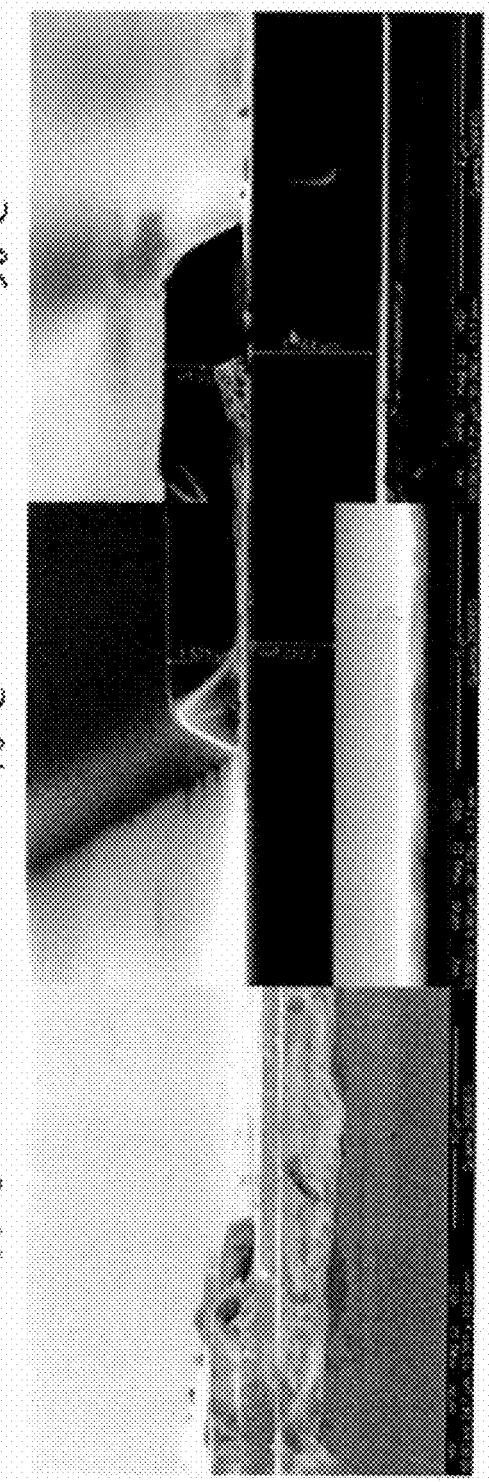

As shown in FIG. 8, temperature can be an important factor in the etching process. FIG. 8 includes multiple scanning electron micrographs showing etch results of boron doped Poly-$Si_{1-x}Ge_x$ mask layers partly covered with photoresist layer under different temperatures. The rest of etching conditions are the same: 100 sccm $SF_6$, 8 sccm $O_2$, ICP power of 1500 W and RF power of 4 W. The chamber pressure is 10 mTorr. It is clear that the uncovered SiGe masks are complete removed with higher temperatures (−50° C., −70° C., −90° C.). Some degree of etching can continue down to −110° C. In those cases, even a considerable undercut can be resulted under the covering photoresist layer. In a sharp contrast, the SiGe mask survives etching with no undercut at lower temperatures.

Figure 9:
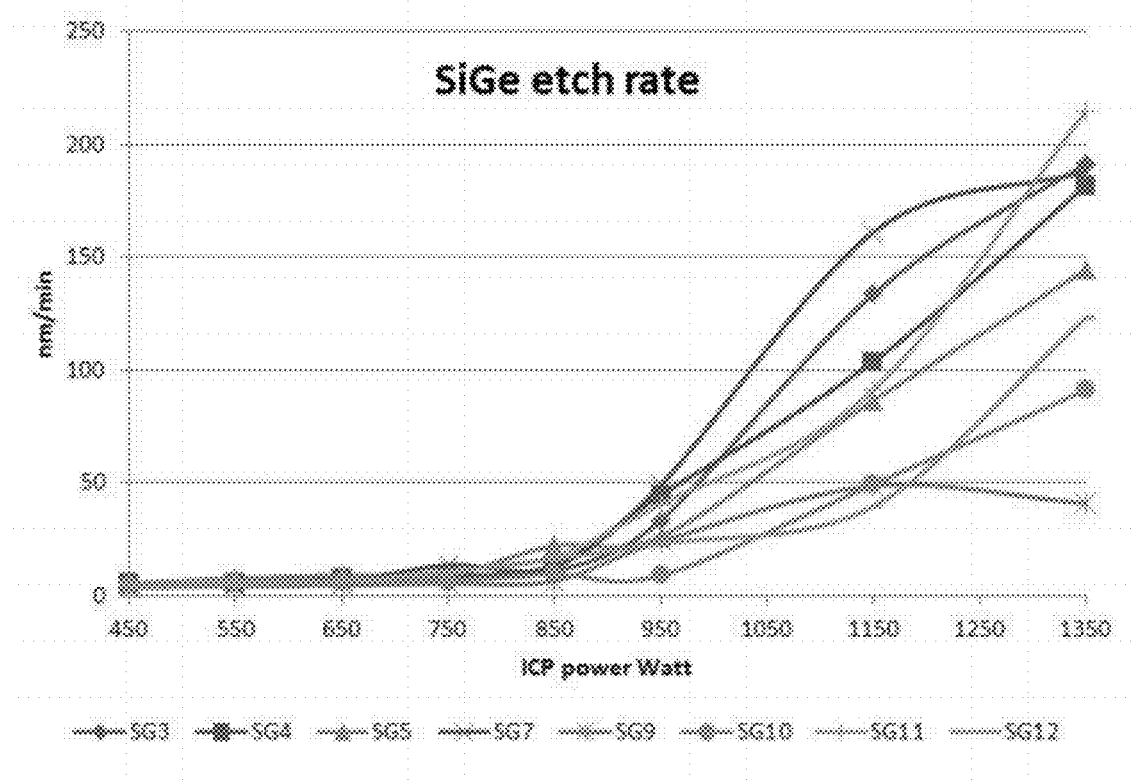
FIG. 9 is a diagram illustrating the effect of ICP power on the etching of silicon germanium hard mask layers according to embodiments of the disclosure.

FIG. 9 illustrates the effect of ICP power on the etching of boron doped Poly-$Si_{1-x}Ge_x$ mask layers under fixed etching conditions (90 sccm $SF_6$, 5 sccm $O_2$, RF power of 4 W, −120° C., 10 mTorr). Samples SG3 through SG12 represent different SiGe mask films deposited using different process conditions in order to examine how those conditions affect the behavior of the SiGe mask films in etch conditions. All of the eight tested films were deposited during the same 40 minute time period. For all eight films, the same gases were applied during the deposition with the same flow rates: $SiH_4$ 25 sccm, $GeH_4$ 50 sccm, $B_2H_6$ 4 sccm, and $N_2$ 110 sccm. The deposition of all eight films used both high and low frequency generators (HF and LF) working in switching mode (at first one, then another etc. with a set up switching time) with different values of power applied. The deposition of all films uses the same chamber pressure of 1500 mTorr.

Below are the different process parameters and the resulting film stress:

SG3: 10 seconds 15 Watt LF/15 seconds 15 Watt HF, temperature of deposition at to 400 C., film stress −7.88 E7 MPa;

SG4 2 seconds 15 Watt LF/10 seconds 15 Watt HF, temperature of deposition at 400 C., film stress −1.86 E7 MPa;

SG5 10 seconds 15 Watt LF/10 seconds 15 Watt HF, temperature of deposition at 250 C., film stress 1.58 E8 MPa;

SG7 10 seconds 15 Watt LF/10 seconds 15 Watt HF, temperature of deposition at 500 C., film stress −4.20 E8 MPa;

SG9 10 seconds 5 Watt LF/10 seconds 5 Watt HF, temperature of deposition at 400 C., film stress −4.76 E7 MPa;

SG10 10 seconds 10 Watt LF/10 seconds 10 Watt HF, temperature of deposition at 400 C., film stress −1.32 E8 MPa;

SG11 10 seconds 20 Watt LF/10 seconds 20 Watt HF, temperature of deposition at 400 C., film stress −2.01 E8 MPa;

SG12 15 seconds 15 Watt LF/10 seconds 15 Watt HF, temperature of deposition at 400 C., film stress −4.47 E7 MPa.

TABLE 3

Deposition conditions and Composition of all tested films

| Wafer No. | Composition (Germanium %) | Deposition Power (W) | % LF Time | Deposition Temperature (° C.) |
|---|---|---|---|---|
| SG1 | 28.8 | 15 | 75% | 400° C. |
| SG2 | 28.8 | 15 | 50% | 400° C. |
| SG3 | 28.8 | 15 | 30% | 400° C. |
| SG4 | 28.8 | 15 | 10% | 400° C. |
| SG5 | 58.5 | 15 | 50% | 250° C. |
| SG6 | 28.8 | 15 | 50% | 600° C. |
| SG7 | 28.8 | 15 | 50% | 500° C. |
| SG8 | / | 15 | 50% | 600° C. |
| SG9 | / | 5 | 50% | 400° C. |
| SG10 | / | 10 | 50% | 400° C. |
| SG11 | / | 20 | 50% | 400° C. |
| SG12 | 28.8 | 15 | 75% | 400° C. |

Figure 10:
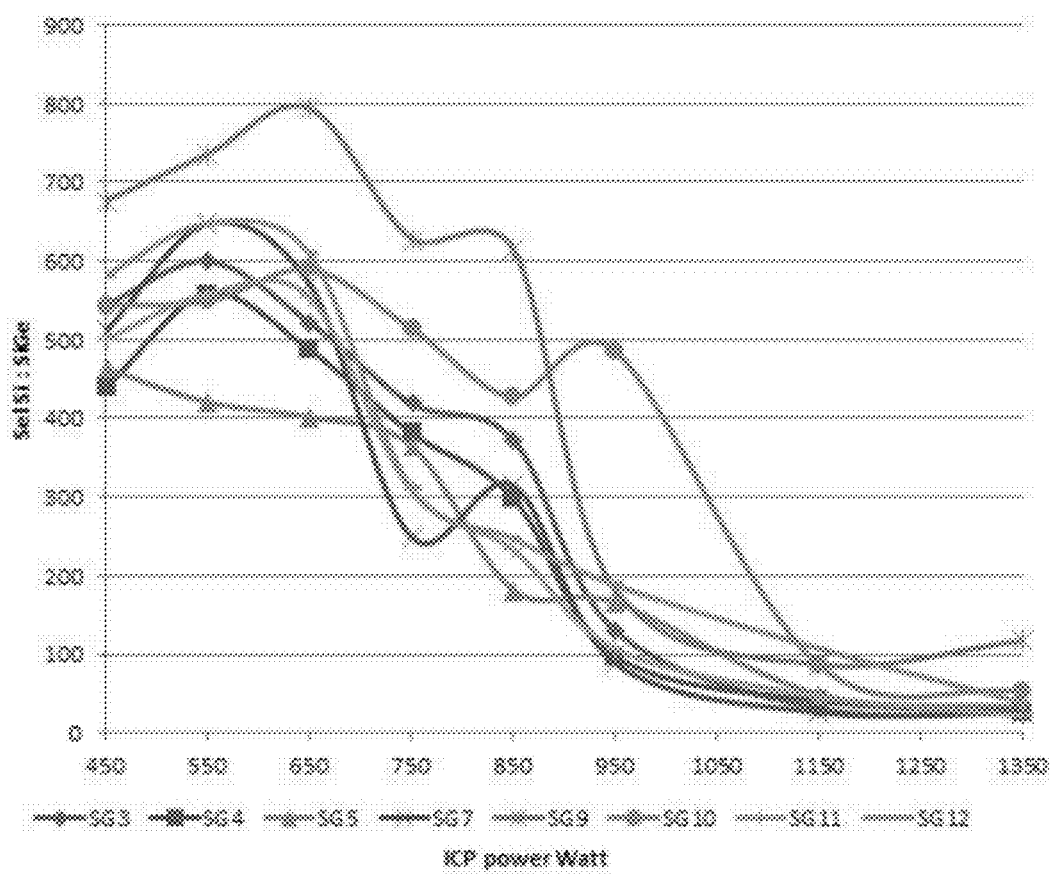
FIG. 10 is a diagram illustrating the effect of ICP power on the etching selectivity of silicon germanium hard mask layers versus silicon according to embodiments of the disclosure.

FIG. 10 illustrates the effect of ICP power on the etching selectivity of boron doped Poly-mask layers versus silicon. Samples SG3 through SG12 represent the same group of different SiGe mask films deposited using different process conditions shown in FIG. 9 in order to examine how those conditions affect the selectivity of the SiGe mask films versus silicon in etch conditions.

From FIGS. 9 and 10, it is clear that, with higher ICP power, the etch rate of the SiGe layer increases, and the selectivity of SiGe versus Silicon will decrease. Therefore, the ICP power of etch process can optimized to achieve good selectivity and a suitable etch rate.

Although the process above is described with respect to etching features in a substrate, the process may also be performed to etch features in other material layers. For example, the process may be used to etch a silicon layer present in a silicon-on-insulator (SOI) substrate. In another example, the process may be used to etch an epitaxial layer of semiconductor material deposited on a glass substrate. The cryogenic etching and stripping of the silicon germanium may take place in the same etching tool to reduce transit time of the wafer between tools. The high etch selectivity of Si:SiGe allows high aspect ratio structures to be etched in silicon layers or substrates. Although described above with respect to one feature, the process may be carried out on a chip- or wafer-level process and include multiple features of different sizes.

The etching process described above may be implemented in the manufacturing of electronic devices such as MEMS devices and semiconductor devices. For example, the process may be used during manufacturing of microprocessors, MEMS rotational rate sensors and accelerometers, microfluidic mixing devices, micro-minors, micro-pillars, deep trench capacitors and isolation for high frequency circuitry, and power devices. These devices may be incorporated into mobile phones, hand-held personal communication systems (PCS) units, portable data units such as personal data assistants, GPS enabled devices, navigation devices, set top boxes, music players, video players, entertainment units, and fixed location data units.

All of the methods and apparatuses disclosed and claimed herein can be made and executed without undue experimentation in light of the present disclosure. While the apparatus and methods of this invention have been described in terms of preferred embodiments, it will be apparent to those of skill in the art that variations may be applied to the methods and in the steps or in the sequence of steps of the method described herein without departing from the concept, spirit and scope of the invention. In addition, modifications may be made to the disclosed apparatus and components may be eliminated or substituted for the components described herein where the same or similar results would be achieved. All such similar substitutes and modifications apparent to those skilled in the art are deemed to be within the spirit, scope, and concept of the invention as defined by the appended claims.

Other embodiments are within the scope of the following claims.

What is claimed is:

1. A method, comprising:
depositing an etch mask on a semiconductor material, wherein the etch mask comprises silicon germanium and the semiconductor material is not silicon germanium;
patterning the etch mask with a plurality of features;
transferring the plurality of features in the etch mask to the semiconductor material at a first temperature by deep reactive ion etching in an $SF_6/O_2$ plasma, and
removing the etch mask at a second temperature by reactive ion etching in an $SF_6/O_2$ plasma, where the second temperature is higher than the first temperature.

2. The method of claim 1, wherein the semiconductor material comprises silicon.

3. The method of claim 2, wherein the semiconductor material comprises a silicon substrate.

4. The method of claim 1, wherein the step of depositing a etch mask comprises performing chemical vapor deposition of silicon germanium.

5. The method of claim 1, wherein the step of performing the reactive ion etch comprises applying inductively coupled plasma and the $SF_6/O_2$ plasma sufficient to remove the silicon germanium and not the semiconductor material.

6. The method of claim 1, wherein the step of performing the deep reactive ion etch comprises cryogenic etching the semiconductor material with the $SF_6/O_2$ plasma.

7. The method of claim 1, further comprising cooling the semiconductor material to a temperature between −80 degrees Celsius and −140 degrees Celsius before transferring.

8. The method of claim 1, wherein patterning the etch mask comprises: forming a transfer material on the etch mask;
patterning the plurality of features into the transfer material; and
transferring the plurality of features into the etch mask.

9. The method of claim 8, wherein the step of forming a transfer material comprises forming a photoresist film on the etch mask.

10. The method of claim 8, wherein patterning the plurality of features into the transfer material comprises patterning with at least one of photolithography, ion beam lithography, or electron beam lithography.

11. The method of claim 8, wherein the step of transferring the plurality of features comprises transferring high aspect ratio features.

12. The method of claim 1, wherein the plurality of features comprises components of at least one of a microprocessor, a micro electro-mechanical system (MEMS) rotational rate sensor, a MEMS accelerometer, a micro-fluidic mixing device, a micro-mirror, a micro-pillar, a deep trench capacitor, an isolation for high frequency circuitry, or a power device.

13. The method of claim 1, further comprising integrating the plurality of features into at least one of a mobile phone, a hand-held personal communication systems (PCS) unit, a portable data unit, a personal data assistant, a GPS enabled device, a navigation device, a set top box, a music player, a video player, an entertainment unit, or a fixed location data unit.

14. The method of claim 1, further comprising removing the etch mask after transferring the plurality of features in the etch mask to the semiconductor material.

15. The method of claim 1, further comprising maintaining the etch mask at a temperature between 10 degrees Celsius and −110 degrees Celsius before removing the etch mask.

16. The method of claim 1, wherein the etch mask comprises boron.

17. The method of claim 1, wherein the etch mask comprises polycrystalline silicon germanium.

18. The method of claim 7, wherein transferring the plurality of features into the etch mask comprises etching the etch mask with an $SF_6/O_2$ plasma at a temperature between 10 degrees Celsius and −110 degrees Celsius.

19. A method, comprising:
depositing an etch mask layer on a semiconductor material, wherein the etch mask layer comprises silicon germanium and the semiconductor material is not silicon germanium;
forming a transfer material on the etch mask layer;
patterning the plurality of features into the transfer material;
transferring the plurality of features into the etch mask layer;
transferring the plurality of features in the etch mask layer to the semiconductor material at a first temperature by deep reactive ion etching in an $SF_6/O_2$ plasma; and
removing the etch mask layer at a second temperature by reactive ion etching in an $SF_6/O_2$ plasma, where the second temperature is higher than the first temperature.

20. A method, comprising:
forming a transfer material on a semiconductor material;
patterning the plurality of features into the transfer material, wherein at least a portion of transfer material is removed from the semiconductor material;
depositing an etch mask layer, wherein the etch mask layer comprises silicon germanium and the semiconductor material is not silicon germanium, and at least a portion of the etch mask layer is in direct contact with the semiconductor material, and at least a portion of the etch mask layer is on top of the transfer material;
removing the transfer material from the semiconductor material, wherein the plurality of features are transferred to the etch mask layer;
transferring the plurality of features in the etch mask layer to the semiconductor material at a first temperature by deep reactive ion etching in an $SF_6/O_2$ plasma; and
removing the etch mask layer at a second temperature by reactive ion etching in an $SF_6/O_2$ plasma, where the second temperature is higher than the first temperature.

* * * * *